United States Patent [19]

Russell

[11] Patent Number: 5,404,358
[45] Date of Patent: Apr. 4, 1995

[54] BOUNDARY SCAN ARCHITECTURE ANALOG EXTENSION

[75] Inventor: Robert J. Russell, South Boston, Mass.

[73] Assignee: Bull HN Information Systems Inc., Billerica, Mass.

[21] Appl. No.: 13,464

[22] Filed: Feb. 4, 1993

[51] Int. Cl.⁶ ............................................. G06F 15/20
[52] U.S. Cl. .................................. 371/22.3; 364/579; 364/580; 371/15.1; 371/22.1; 371/22.5; 371/22.6
[58] Field of Search ............... 364/579, 580; 371/15.1, 371/22.1, 22.3, 22.5, 22.6

[56] References Cited

U.S. PATENT DOCUMENTS

| | | | |
|---|---|---|---|
| 3,582,902 | 6/1971 | Hirtle et al. | 364/DIG. 2 X |
| 4,357,703 | 11/1982 | Van Brunt | 371/22.5 |
| 5,225,834 | 7/1993 | Imai et al. | 371/22.1 X |
| 5,285,152 | 2/1994 | Hunter | 324/158 R |
| 5,291,495 | 3/1994 | Udell, Jr. | 371/22.3 |

OTHER PUBLICATIONS

"Mixed-Signal Testing Using Analog Scan Design" by Richard Hulse, published by Computer Design Magazine in the 1992 Analog & Mixed-Signal Design Conference Proceedings, Oct. 28-30, 1992, Section 244.

Primary Examiner—Edward R. Cosimano
Attorney, Agent, or Firm—Faith F. Driscoll; John S. Solakian

[57] ABSTRACT

A method and apparatus provides an analog mode of operation of a standard test access bus interface based on a standard Boundary Scan architecture which is limited to use of digital signals. Circuits are included in the interface which enable this sharing of data paths at separate time intervals defined under instruction control for processing analog and digital signals thereby providing a hybrid capability without any increase in the number of lines required by the interface.

20 Claims, 7 Drawing Sheets

BOUNDARY SCAN ARCHITECTURE ANALOG EXTENSION

RELATED APPLICATION

The patent application of Robert J. Russell entitled, "Boundary Scan Architecture Extension," filed on Oct. 29, 1992, bearing Ser. No. 07/968,104, which is assigned to the same assignee as this patent application.

BACKGROUND OF THE INVENTION

1. Field of Use

The present invention relates to electronic integrated circuits (ICs) and, more particularly, to circuits which employ a standard boundary scan test access port.

2. Prior Art

A standard boundary scan test architecture was approved by the American National Standards Institute (ANSI) and the Institute of Electrical and Electronics Engineers (IEEE) in 1990. This architecture provides a means by which ICs may be designed in a standard fashion such that they or their external connections, or both, may be tested using a four or five wire interface.

The roots of boundary scan testing are found in the scan test methodology developed in the 1960s. An example of one implementation of this technology is described in U.S. Pat. No. 3,582,902, granted Jun. 1, 1971. The basic scan concept is to join all storage elements (e.g., flip-flops) of a logic design in one or more serial strings. The serial, or shift register, interconnection is in addition to the normal functional interconnection, and is intended to be primarily used during testing. Although this hardly makes the testing of complex systems easy to accomplish, scanning reduces the overwhelming chore from simulating sequential systems to the more manageable chore of simulating combinatorial systems.

It is important to note that the addition of scan circuitry does not benefit the functional role of the logic system to which it is added. Test circuitry is deemed undesirable overhead which would not be included if there were other practical ways of eliminating faults. Therefore, test simplification is a powerful economic incentive.

The complexities which arise from the use of the basic scan concept were the motivation behind the development of the boundary scan test architecture. Developing a test for a design using the original scan concept required simulating large sections of a system, or an entire system. During diagnosis, failing tests often could not be readily correlated with actual faults. The reason was that any one error indication sensed at the test system could be the result of one or more of a large number of faulty devices or interconnects, even when it was assumed that the integrity of the scan string was in tact (i.e., provided a fault free path).

In the boundary scan test architecture, a serial string is placed at the periphery of the IC, independent of storage element locations. A four or five wire interface between the various ICs of a system so designed to include the boundary scan test architecture in conjunction with a test system allows separate and isolated testing of the ICs and the connections between them. The end result provides a much simplified correlation between failing tests and physical faults.

Until now, scan testing has been regarded as purely digital. While methods have been proposed to test analog devices in conjunction with digital scan testing, they all share the approach of converting analog signal levels to digital signal levels and vice-versa as part of the interface between the test system and the analog devices to be tested. Where such conversion must be avoided, separate interconnections from the digital serial string are made between the test system and the analog devices to be tested. In this case, the digital serial string serves merely as part of a routing control mechanism for the analog signals.

Although the ability to accomplish analog testing with the same overhead test circuitry as used for digital testing is most desirable, until now implementing such an arrangement has been generally viewed as impractical. For example, separate IEEE working groups are developing different digital and analog test bus standards. It is generally the view in the testing field that in-circuit testers will not be replaced regardless of strides made in boundary scan testing because analog device testing is beyond the reach of the standard boundary scan architecture. Position papers presented at the 1992 IEEE International Test Conference in conjunction with a panel on mixed signal testing (proceedings pp. 555–557) indicate separate package pins might be used in an analog test architecture for analog test purposes, in addition to the pins used in the boundary scan architecture.

Significant benefit would be derived if it was possible to test analog devices utilizing the four or five package pin overhead test circuitry already largely found acceptable in the industry used to accomplish digital testing via boundary scan. This could often eliminate the need for in-circuit test stations in manufacturing. Also, this could often avoid the use of test points to accommodate such analog testing in printed circuit board designs involving optimum miniaturization. Furthermore, this could allow for analog testing at the internal IC device level.

Accordingly, it is a primary object of the present invention to provide a method and apparatus for analog and digital signal processing by an interface generally compatible with a standard boundary scan architecture.

It is a further object of the present invention to provide a method and means of testing analog components and devices utilizing such interface in conjunction with current digital scanning techniques.

It is a still further object of the present invention to provide the method and means for an analog interface which has no significant detriment to the digital scanning techniques already in place.

SUMMARY OF THE INVENTION

The above objects and advantages of the present invention are achieved in a preferred embodiment of a boundary scan interface included in an IC device which provides electronic access to circuits within the IC device. These circuits in turn provide access by circuits which externally connect to the IC device. According to the present invention, the interface is extended by including analog test circuits in the interface which share the same data pins normally used exclusively for processing digital signals. The sharing of such pins is accomplished by means of time allocation.

During certain time intervals, the data pins and associated circuits are used for passing digital signals. At other times, the same data pins and other circuits are used to pass analog signals. Sharing is controlled by digital test circuitry internal to the IC. Such circuits are activated in response to instructions applied during previous time intervals via the data pins of the interface. The remaining two or three pins of the boundary scan interface are also used to control sharing and the operation of the analog test circuits.

The interface of each IC device compatible with the standard is required to be initialized to a reset state within five cycles of the interface test clock signal (TCK) or when an interface test reset signal (TRST*) is activated. In the present invention, the digital test circuitry becomes activated at this point and the analog test circuits are disabled. The digital test circuitry continues to operate in the same manner as a standard digital boundary scan interface until all required data including instructions in preparation for analog activity have been passed. Data is passed to and from the IC device via interface test data in (TDI) and test data out (TDO) signal pins. Control of passing the data is achieved through an interface test mode select (TMS) signal pin in conjunction with signal TCK and signals from a state machine internal to each boundary scan IC interface. In the preferred embodiment, preparation for analog activity is done in two phases. First, data is loaded into an analog control register included in the interface. Second, an instruction is loaded into an instruction register with the interface, specifying an analog mode of operation. The instruction when decoded activates the analog mode of operation.

In the preferred embodiment, the analog control register is constructed like a digital register. Data bits are shifted into the analog control register as they would be shifted into any digital register of the interface. In some implementations, a digital test register, already included as part of the boundary scan interface, may be used to serve a dual role by having such register store the bits that otherwise would have been allocated to be stored in a separate analog control register.

Once the analog control bits have been stored in the analog control register, the data bits of an analog instruction are loaded into the instruction register when the appropriate state of the state machine is established by means of signals TCK and TMS (assuming TRST* is not asserted). The analog instruction upon being decoded activates the analog test circuits under further control of the bits previously loaded into the analog control register. In the preferred embodiment, these bits selectively enable a number of analog switches included within the analog test circuits which connect to a number of test and control points within the IC device. Stated differently, these bits are used to define the connect and disconnect states of the analog switches. Further control of the analog test circuits is made by alternating the voltage levels of signal TCK between a logic zero and one.

Signal levels on the TCK, TMS and TRST* interface pins remain digital at all times. Pins TDI and TDO assume digital levels except when analog instructions are active, at which times either or both signals may assume analog signal levels. Once an analog instruction is decoded, the interface operates in the analog mode while the state machine is in a state known as the Run-Test/Idle state.

When the interface is being operated in the analog mode, the analog switches within the IC device, connect analog measurement circuits of a tester, usually external to a printed circuit board or system containing a string of similarly constructed IC devices to select the points to be controlled (i.e., by applying voltage/current) or to be measured. In the preferred embodiment, the analog measurements are made by connecting the tester to pins TDI and TDO at the ends of the IC string or strings and to system ground. A separate power pin (TPWR) for powering the interface provides the capability of measuring analog components with no power applied to functional system circuitry.

DESCRIPTION OF THE PREFERRED EMBODIMENT

Figure 1:
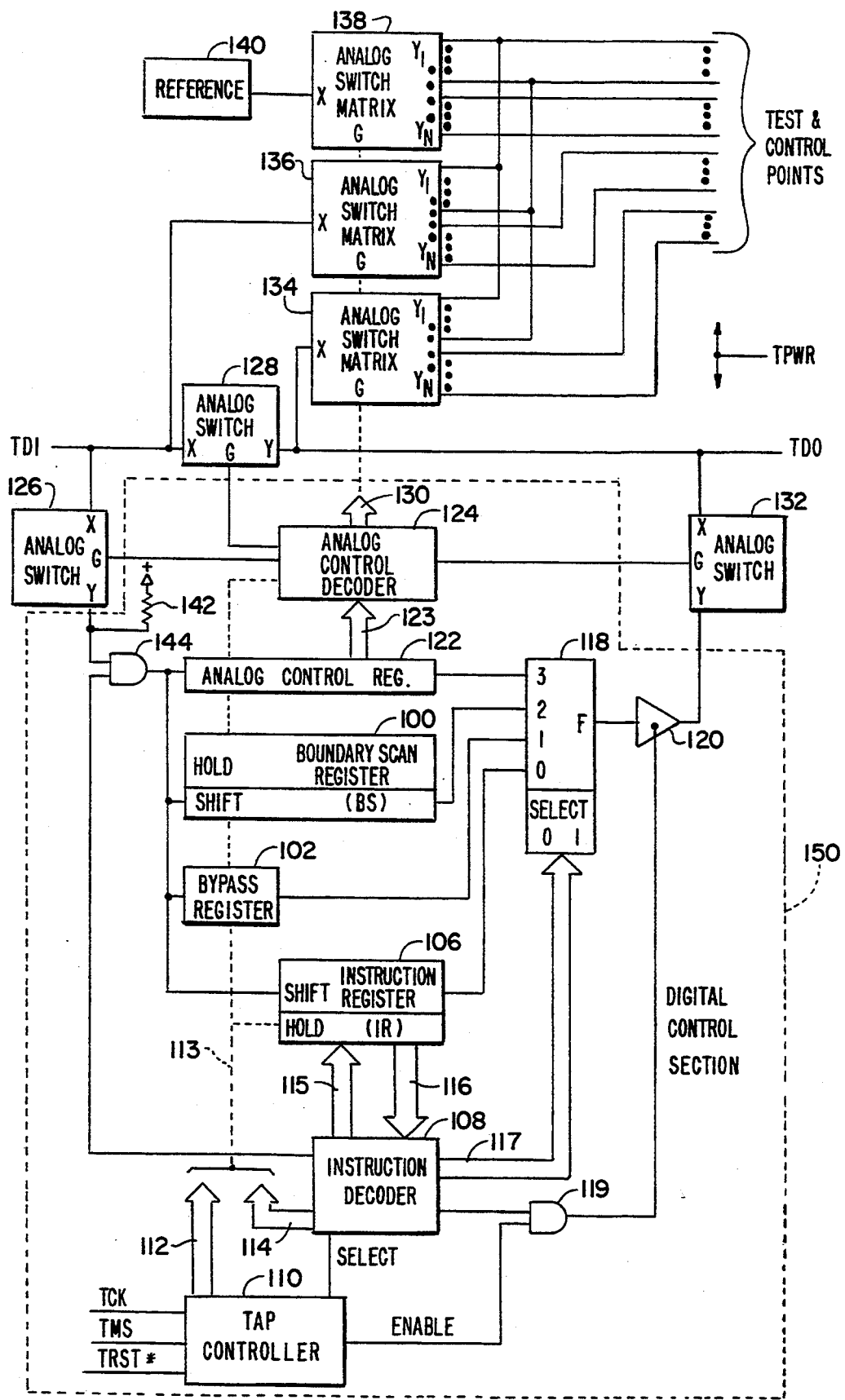
FIG. 1 is a block diagram of a hybrid test system of the present invention showing both the analog and digital section.

FIG. 1 shows standard test access port (TAP) which implements boundary scan testing altered to incorporate the analog test circuits of the present invention. As discussed herein, a substantial portion of the circuits in FIG. 1 included in a digital control section such as block 150 corresponds to the circuits described in the IEEE boundary scan test architecture standard and in the cited related copending patent application.

The circuits of FIG. 1 provide two modes of operation: analog and digital. In the analog mode, analog signals or levels may be transmitted between circuitry external to an IC device containing the present invention and analog circuitry within the IC or to other ICs containing the interface circuits of the present invention. These circuits operate essentially in the same manner as standard boundary scan compatible units, where the TDI and TDO pins are connected to circuitry intended to transmit or receive only digital information.

The analog circuits of the present invention include analog switches 126, 132, 128 and analog switch matrices 134, 136 and 138 connected as shown. Analog switches 126 and 132 provide isolation to prevent interference by digital circuitry of block 150 during analog measurements. For the purposes of the present invention, the analog switches are standard circuits having a control input (designated here as G) which electronically connects or disconnects a path between two terminals (designated here as X and Y). Such circuits are commonly used in commercially available ICs, an example of such a circuit is analog switch circuit designated as MC74HC4066, manufactured by Motorola, Inc. and described in the High-Speed CMOS Logic Data manual DL129 Rev. 4 dated 1989. A nominal resistance of 100 ohms is the typical resistance between the X and Y points in the connect state for such device, although the resistance value for analog switches in general has been noted to decrease with improvements in technology. Isolation resistances greater than a megohm are typical for analog switches in the disconnect state. The G input is a digital control point wherein a voltage corresponding to a logic one establishes the connect state, and a voltage corresponding to a logic zero, establishes the disconnect state. Switches 126 and 132 can be omitted by designing the circuitry within the digital gate circuits (e.g. 144) connected to pins TDI and TDO so as to provide such isolation and by eliminating the objects of pull-up resistor 142 by various known techniques. The pull-up resistor 142 is included for compatibility with the boundary scan standard.

Analog switch 128 is used to pass analog signals bi-directionally between pins TDI and TDO during analog operations when other ICs are selecting measurement points or when an analog switch matrix directly connected to one of the two pins TDI and TDO is required to be connected to the other pin. When the test circuitry of the interface is in the digital mode of operation, analog switch 128 isolates pin TDI from pin TDO in conformance with standard boundary scan architecture.

The analog switch matrices 134, 136 and 138 are groups of analog switches for connecting pins TDI and TDO, and internal IC device reference points to test and control points within the IC device, separately or together, as desired. In the preferred embodiment, each system functional input and output pin of the IC device (not shown) is connected to each of the three matrices 134, 136 and 138. The selection of particular pin or internal point connections is a matter of design choice. In the preferred embodiment, matrix 138 is connected to IC ground reference voltage, represented as reference point 140. Other reference voltage points and additional switch matrices may be utilized as a matter of design choice.

For clarity, matrices 134, 136 and 138 are shown as separate physical elements with a single X point, numerous Y points and a single set of G points. In the preferred embodiment, each matrix consists of a set of individual analog switches with its individual G control inputs connected to an analog control decoder 124 via one of the set of control lines 130. The selection of a particular matrix implementation is a matter of design preference as long as the proper matrix functionality is preserved.

Analog control decoder 124 drives the various analog switch control gate inputs G over the set of lines 130 according to the contents previously loaded into an analog control register 122, connected to decoder 124 via lines 123, output of an instruction decoder 108, connected to decoder 124 via lines 114, and the state of a test access port (TAP) controller 110, connected to decoder 124 via lines 112. In particular, the TAP controller Run-Test/Idle state is utilized. For clarity, lines 112 and lines 114 are combined as lines 113 in FIG. 1. In the preferred embodiment, signal TCK is among the signals applied to lines 112 and 113 to allow alternate matrix selection without having to alter the contents of analog control register 122.

TPWR is a separate power input to the circuitry of FIG. 1 which allows selected test operations to be conducted when system functional circuits are powered down. The inclusion of separate power capability is an optional part of the preferred embodiment of the present invention. This capability is unnecessary when only powered up conditions of the system circuits are to be monitored or controlled.

The circuitry of block 150 while not novel in construction contains certain features and characteristics that would not be included were the present invention not part of the IC device. These features and characteristics are discussed below where appropriate.

In the standard boundary scan architecture, there are three digital shift registers in the TDI to TDO data path. These are instruction register 106, bypass register 102 and boundary scan register 100. The first register 106 provides a means for shifting and holding both standard and optional instructions transmitted over the TDI to TDO path from outside the IC. Shifting means and holding means are separate parts of the register. The second register 102 provides a means of passing data intended for or passed from other ICs connected to pin TDI or pin TDO in a single shift step. The third register 100 provides a drive or receive data path to the system functional digital signal pins of the IC. In the preferred embodiment of the present invention, block 150 includes an analog control register 122 which can be an optional fourth register of the standard boundary scan architecture. It is constructed in the same manner as a standard shift register. Bits held in analog control register 122 drive analog control decoder 124 via lines 123.

An AND gate 144, multiplexer 118 and driver 120 complete the TDI to TDO path of section 150 of FIG. 1. Gate 144 which is optional, buffers the digital shift registers 100, 102, 106 and 122 from analog signals arriving at the TDI pin connection when optional switch 126 is omitted. Multiplexer 118 selects the digital register to be used in the TDI to TDO data path according to contents of the instruction register 106 and state of TAP controller 110 decoded by instruction decoder 108 and applied via lines 117. Driver 120 passes data received from multiplexer 118 when enabled by an AND gate 119 during digital operations in response to signals from instruction decoder 108 and TAP controller 110.

The instruction register 106 drives instruction decoder 108 via lines 116. As described in the cited related patent application, lines 115 are included to prevent instruction register changes for certain optional instructions except for reset operations resulting from the manipulation of input TRST* or TMS and TCK.

Signals applied to lines 112 from the TAP controller 110 and lines 114 from the instruction decoder 108, shown as combined in lines 113 of FIG. 1 are used to control the digital registers and analog decoder 124.

It will be appreciated by those skilled in the art that the instruction decoder is implemented such that the decoding of an analog instruction does not by itself interfere with normal system functional operation (e.g. does not produce glitches at signal pins). This requirement is the same as the requirement established for certain digital instructions defined in the previously referenced boundary scan standard.

TAP controller 110 receives as inputs, signals TCK, TMS and TRST* are the same as those of the standard boundary scan architecture.

DETAILED DESCRIPTION OF CIRCUITS OF FIG. 1

Figure 5:
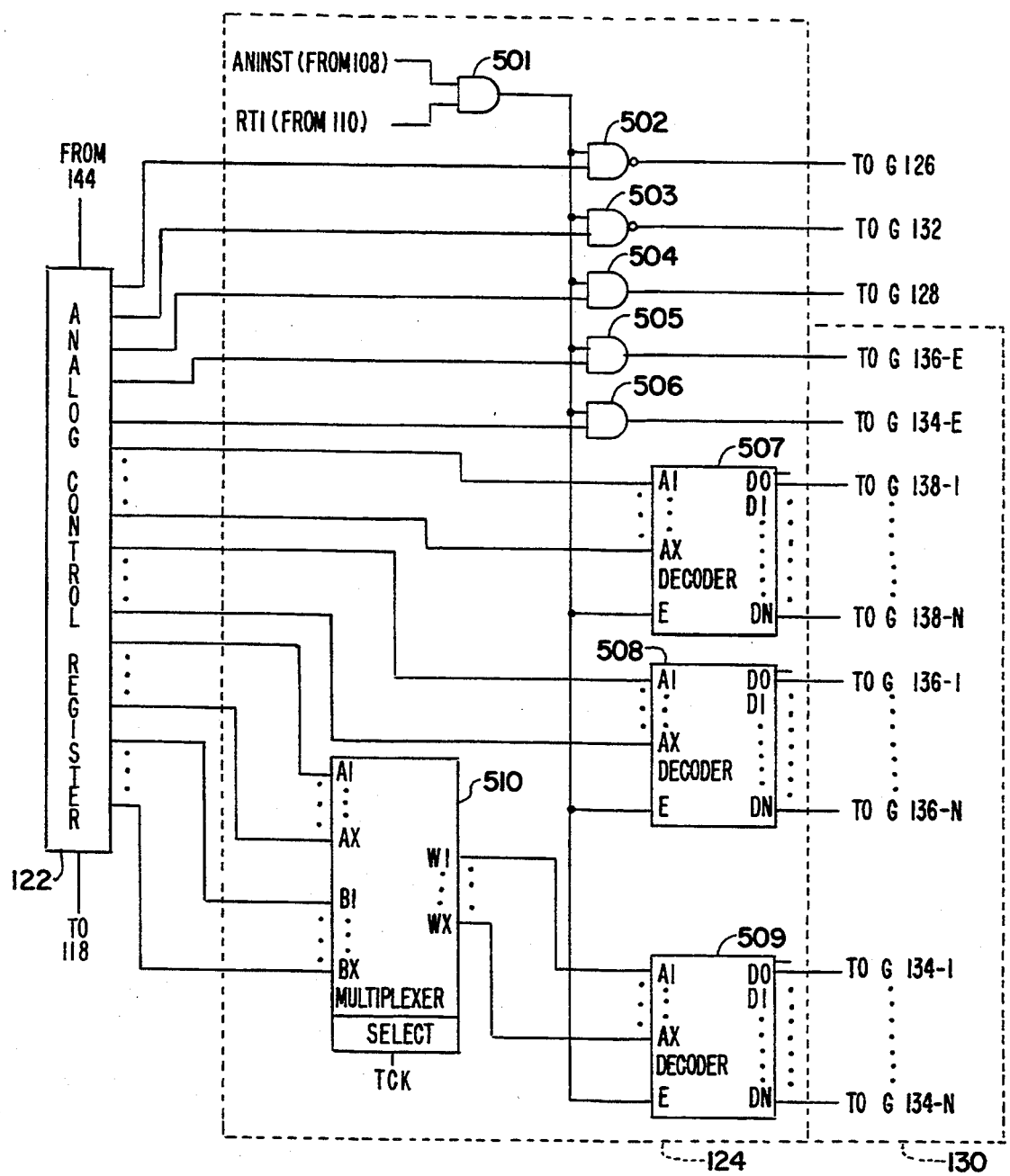
FIG. 5 shows in greater detail, the analog control decoder of FIG. 1.
Figure 6:
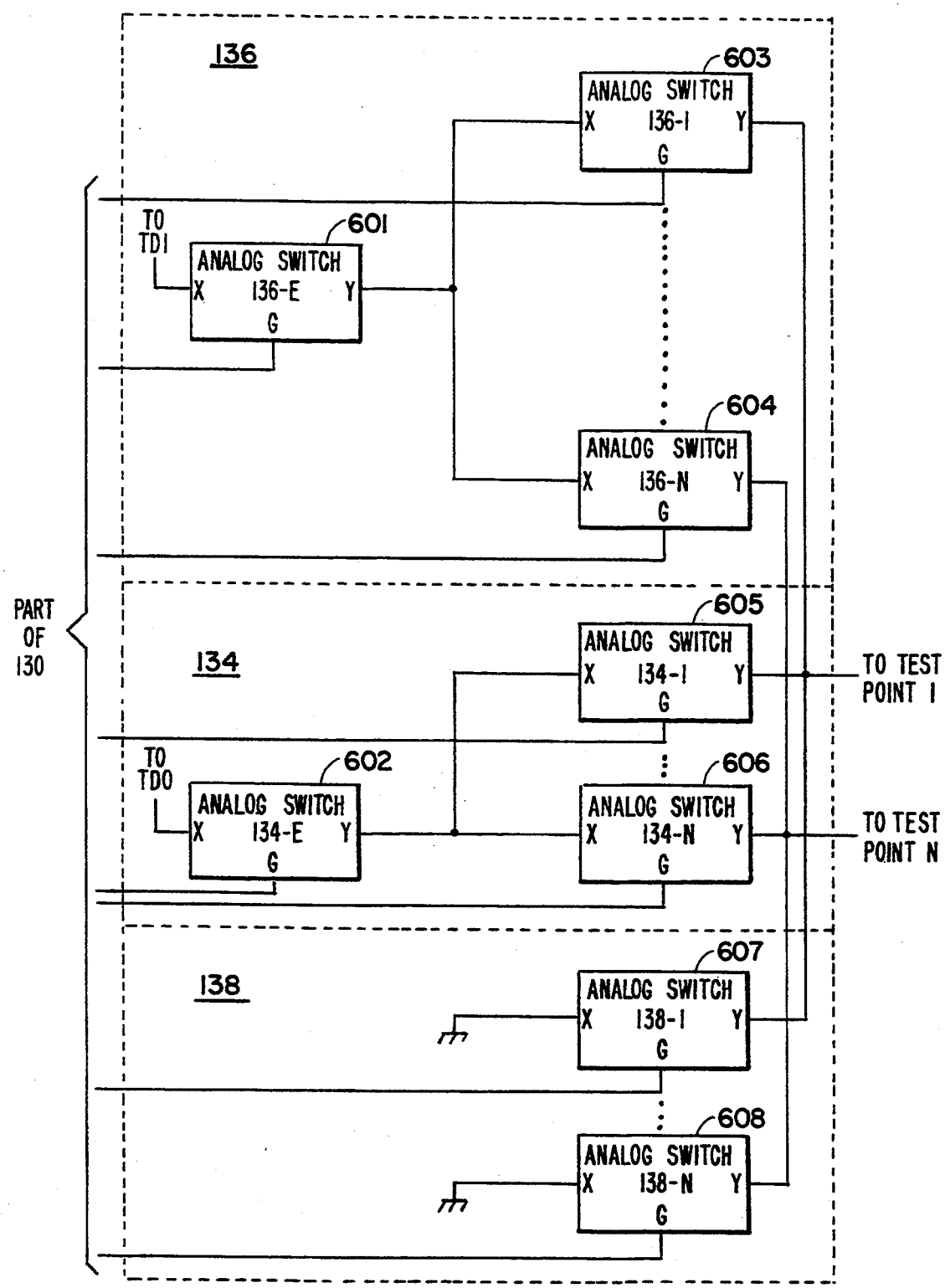
FIG. 6 shows in greater detail, the analog switch matrices of FIG. 1.
Figure 7:
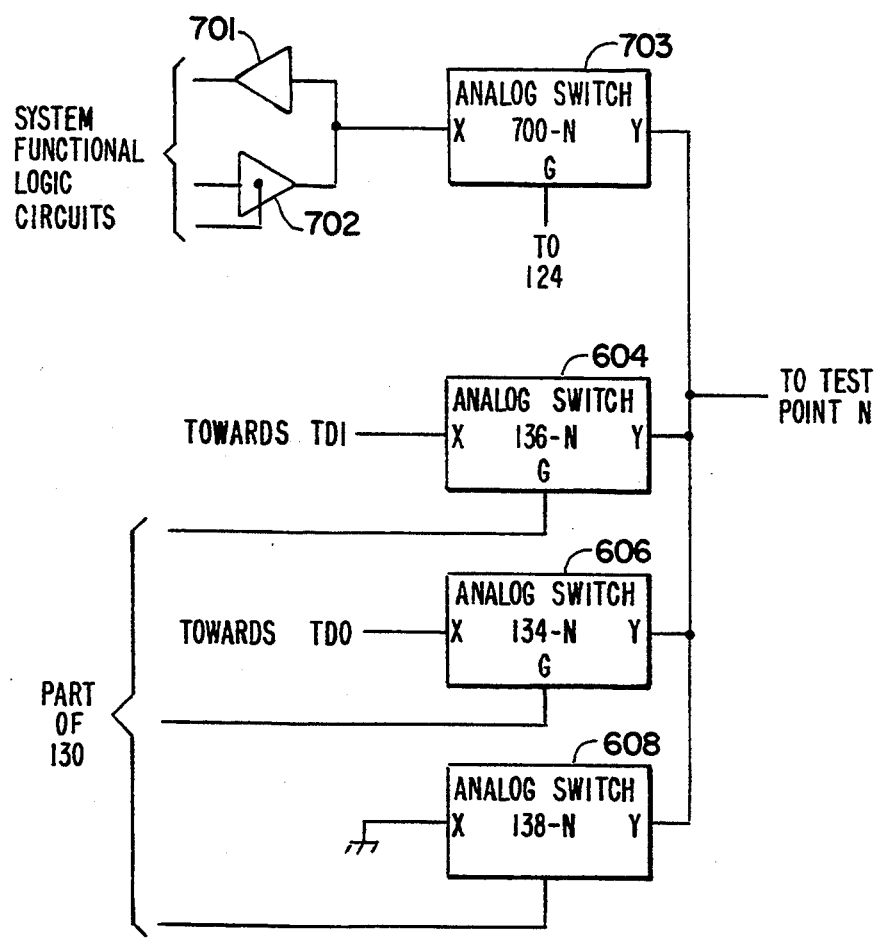
FIG. 7 shows the connections at a test point between the analog switch matrices and system functional circuits.

FIGS. 5, 6 and 7 disclose in greater detail, different aspects of the system of FIG. 1. FIG. 5 shows the analog control decoder 124 in greater detail. Analog control register 122 contains sufficient bits for each analog switch to be controlled, including the analog switches of the switch matrices 134, 136 and 138. In the preferred embodiment, five bits are used to individually control each of the analog switches and the analog switches of each of the matrices 134, 136 and 138 connected to pin TDI or pin TDO. These five control points are shown as the G inputs of analog switches 126, 128 and 132 in FIG. 1 and analog switches 601 and 602 in FIG. 6. Four additional sets of bits within analog control register 122 select one of the points (one of N) previously chosen to test or control. Each set of bits contains a number of bits such that two raised to the power of that number is equal to or greater than the number of test points plus one (N+1). For example, four sets of six bits would be used to control 63 test points.

An AND gate 501 of FIG. 5 provides the primary gating function for the analog switches and switching matrices (i.e., configures switches and matrices). This gate generates a logic one output signal when an analog instruction is decoded by instruction decoder 108 (i.e., input ANINST=1) and the TAP controller 110 is in the run-test/idle state (i.e., input RTI=1). The first five bits of analog control register (those closest to pin TDI) connect as inputs to gates 502 through 506. NAND gates 502 and 503 connect to the G inputs of analog switches 126 and 132 respectively. When the TAP controller 110 is in the reset state, the output of AND gate 501 is forced to a logic zero voltage level (i.e., both signals ANINST and RTI are at logic zero voltage levels at this time). This causes gates 502 and 503 to force the G inputs of analog switches 126 and 132 to logic one voltage levels placing them in the connect state. AND gates 504 through 506 cause a logic zero level to be applied to the G inputs of analog switches 128 of FIG. 1 and 136-E and 134-E of blocks 601 and 602 respectively of FIG. 6, placing them in the disconnect state. Decoders 507 through 509 operate such that all outputs are zero when the E-input is at a logic zero voltage level. Thus, all analog switch matrix G inputs will be at a logic zero voltage level placing all matrix switches in the disconnect state. Therefore, when TAP controller 110 is in the reset state, the TDI to TDO data path is enabled through analog switches 126 and 132, while the TDI/TDO analog switch 128 and all analog test and control points are disconnected.

When input signals RTI and ANINST are both at logic one levels, gates 502 through 506 are individually controlled by the first five bits of analog control register 122. At the same time, the sixth bit of register 122 and those following bits that are connected to the binary weighted inputs of decoder 507 (A1 through AX) cause one of the decoder outputs (D0 through DX) to be forced to a logic one level, placing one of the analog switches of matrix 138 in the connect state except for output D0 when no analog switch is selected (i.e., D0 is unconnected). The next group of bits of analog control register 122 having the same number as those connected to the inputs of decoder 507 are similarly connected to decoder 508 whose outputs are similarly connected to matrix 136.

The next two groups of bits of analog control register 122 contain the same number of bits as the previous two groups. The first group of bits connects in order to inputs A1 through AX of multiplexer 510. The second group of bits connects in order to inputs B1 through BX of the same multiplexer 510. Signal TCK is connected to the select input of multiplexer 510. When signal TCK is at a logic zero voltage level, it forces outputs W1 through WX to the respective values applied to inputs A1 through AX. When signal TCK is at a logic one voltage level, outputs W1 through WX of multiplexer 510 have the same values as those present at inputs B1 through BX. Decoder 509 inputs A1 through AX are connected to respective ones of the outputs W1 through WX of multiplexer 510. The outputs W1 through WX are in turn applied to the G inputs of matrix 134.

Thus, matrix 134 switches are gated in a manner similar to matrices 138 and 136, but from either of two sets of bits of analog control register 122, the set in use being determined by the state of logic level of signal TCK.

FIG. 6 shows in greater detail, connections to the analog switches of matrices 134, 136 and 138 relative to a single test point N. As shown, the single test point, N, is connected to each of the three analog switch matrices 134, 136 and 138 through the corresponding analog switch of each matrix, namely switches 134-N, 136-N and 138-N of blocks 606, 604 and 608 respectively. Individual analog switches 136-1 through 136-N of blocks 608 through 604 are connected together at their X terminals to form a bus which is connected to the Y terminal of an analog switch 136-E of block 601. This switch provides a further level of isolation between pin TDI and analog switches 136-1 through 136-N of blocks 603 through 604 when they are all in the disconnect state.

AS indicated in FIG. 6, analog switches 134-1 through 134-N of blocks 605 through 606 and 134-E of block 602 are similarly connected as shown. The X terminal of each analog switch (i.e., blocks 607 through 608) of analog matrix 138 is connected to IC internal ground potential. As indicated, there is no analog switch in matrix 138 corresponding to 134-E of block 602 or 136-E of block 601. The G terminals of all of the analog switches of FIG. 6 connect to corresponding decoder outputs of FIG. 5.

FIG. 7 illustrates representative connections between the functional system circuitry at a test point N, such as external connection point or pin, and analog switches of analog switch matrices 134, 136 and 138. A receiver circuit 701 and a driver circuit 702 provide the interface to the IC system functional logic circuits. In the preferred embodiment, the driver and receiver circuits 701 and 702 would also connect directly to the test point N and to the Y terminals of corresponding ones of analog switches 134-N, 136-N and 138-N. These analog switches are designated as 604 through 608 in FIG. 7. For purposes of isolation, another analog switch 703 can be connected between the driver and receiver circuits 701 and 702 and test point N. This switch would be part of another analog switch matrix 700 (i.e., 700-N) and which would be controlled by additional bits of analog control register 122 and additional decode logic circuits. This analog switch 703 would provide a means of isolating certain system functional circuits from other such circuits such that analog measurements otherwise only possible with system power off could now be made with system power on. This would eliminate the need to provide the separate power pin TPWR.

DESCRIPTION OF OPERATION

With reference to FIGS. 1 through 7, the operation of the present invention will now be described.

Figure 2:
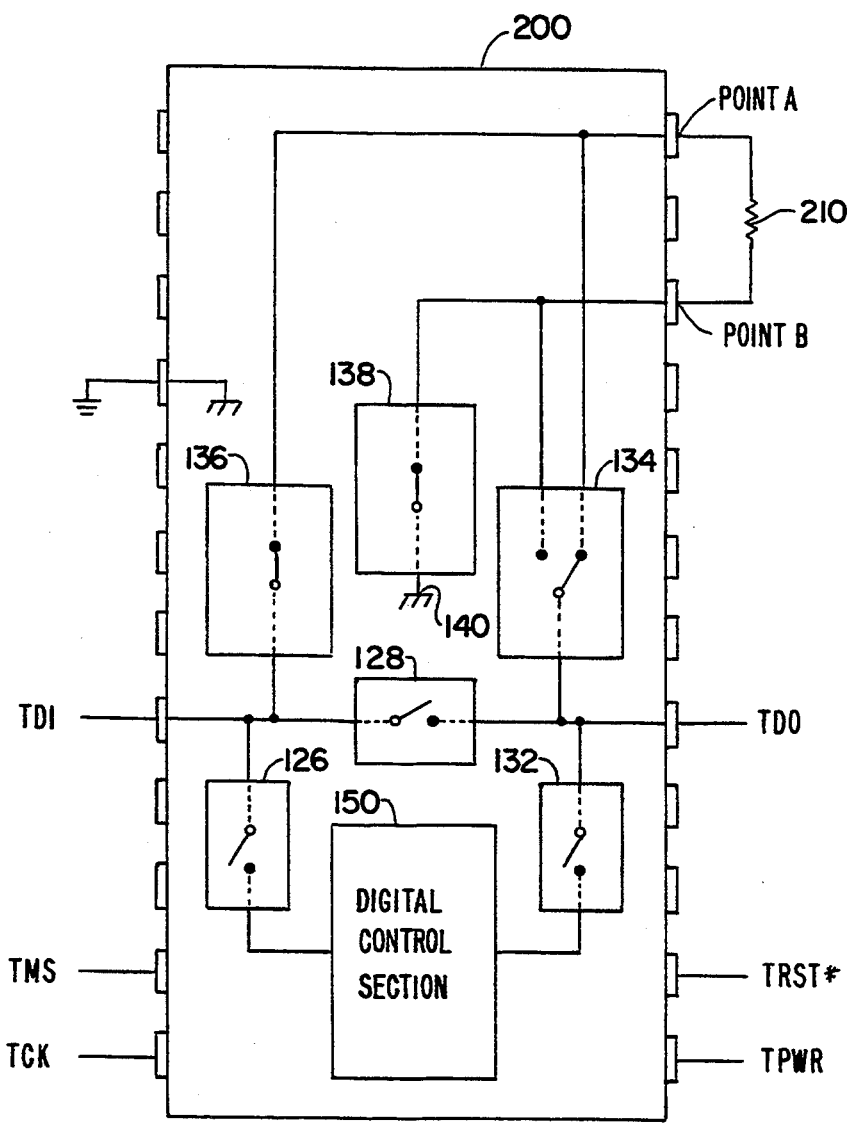
FIG. 2 shows how the analog test circuits of the present invention measures an external analog component between two pins of the same IC.
Figure 3:
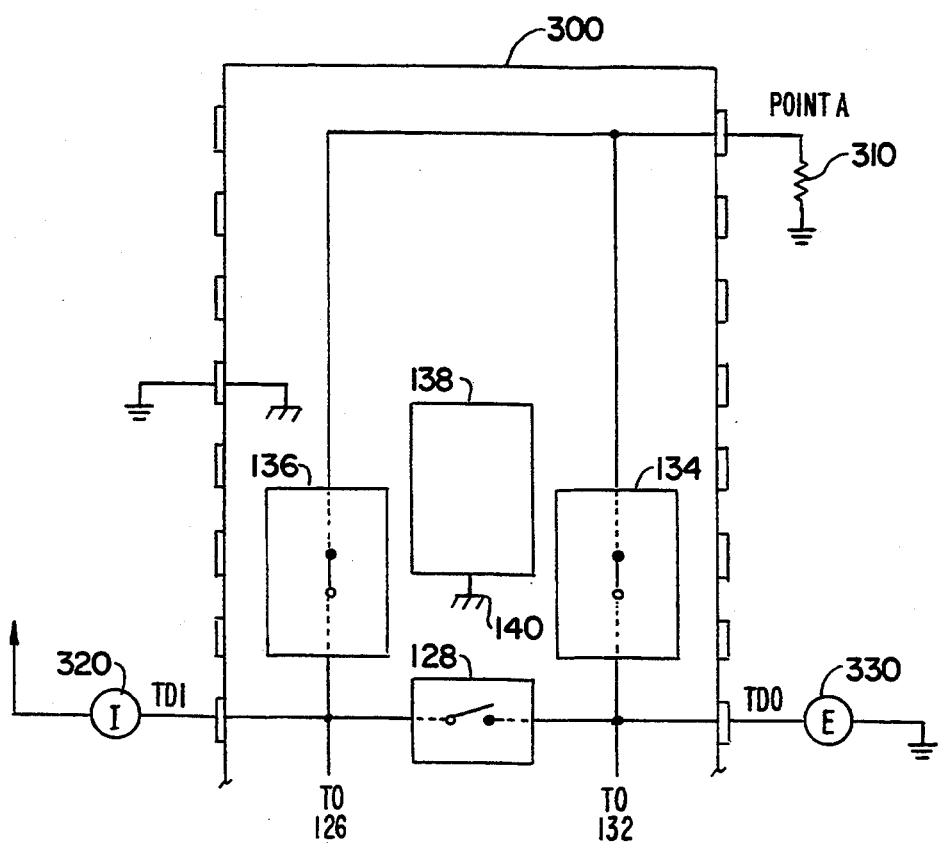
FIG. 3 shows how the analog test circuits of the present invention measures a component connected between an IC pin and ground.
Figure 4:
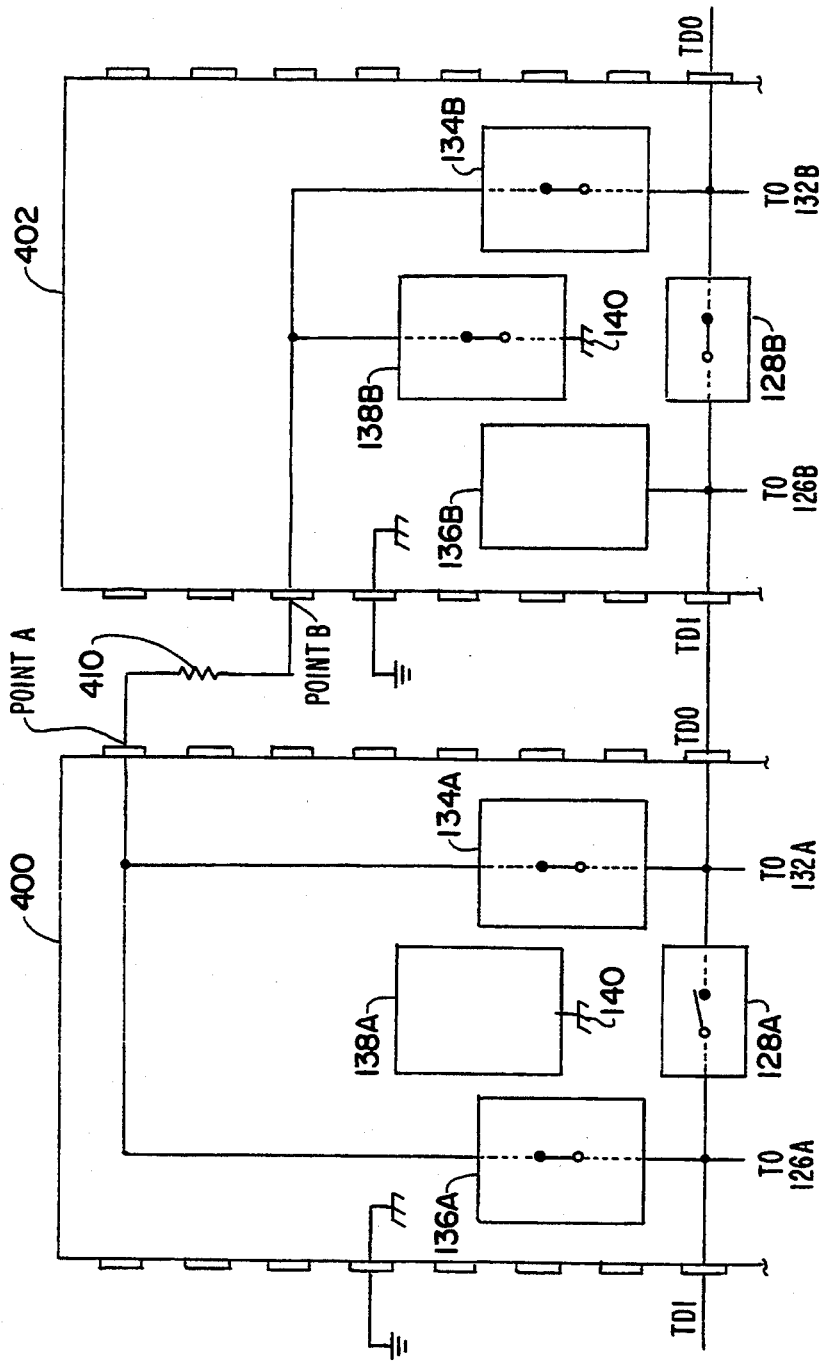
FIG. 4 shows how the analog test circuits of the present invention measures a component connected between pins of two ICs.

For illustrative purposes, in regard to FIGS. 2, 3 and 4, the establishment of connections within analog switch matrices 134, 136 and 138 are shown as dashed lines connected to schematic symbol of switches. Where one of two connections are alternatively made within the same matrix, a two-position switch is shown. Similarly, analog switches 126, 128 and 132 are shown as connected or disconnected switches. To simplify explanation, the analog control register 122 (ACR), analog switch matrices 134, 136 and 138 (ASMs) and analog switches (ASWs) will be referenced by their respective abbreviations.

Description of FIG. 2

FIG. 2 illustrates measuring the value of a resistor 210 connected to two pins of an integrated circuit 200 utilizing the present invention. The resistor is shown to be external to the IC, but the measurement process would be the same were it internal. Point A and point B represent pins of IC 200 which connect to resistor 210.

The steps required to measure resistor 210 utilizing the present invention may be summarized as follows:
1. Set isolation.
2. Reset TAP.
3. Set ACR122 in data path.
4. Load ACR122 to provide the following ASM and ASW settings:
   ASW 126, 128, 132=disconnect state
   B. ASW 134-E, 136-E=connect state
   C. ASM 136=connect state to Point A
   D. ASM 138=connect state to Point B
   E. ASM 134=connect state to Point A when TCK=1
   F. ASM 134=connect state to Point B when TCK=0.
5. Load ANALOG instruction in Instruction Register.
6. Suspend TAP activity at RTI state with TCK=1, TMS=0.
7. Apply voltage to TDI, measure current.
8. Measure voltage from TDO to system ground.
9. Set TCK=0.
10. Repeat step 8.
11. Calculate value of resistor 210.

In step 1, power to the system functional circuitry is removed and only pin TPWR is utilized to apply power. Other means may be used to isolate resistor 210, such as ASWs equivalent to ASW 703 of FIG. 7. Otherwise, the effect of such power would have to be considered when later determining an acceptable deviation from the measurements made.

In step 2, the test access port is reset by applying five cycles of TCK with TMS at a logic one or by temporarily asserting TRST*, as explained previously. Also, as described previously relative to FIG. 5, the ASMs and ASWs are configured via gate 501 for digital data transfer as a result of TAP reset.

In step 3, ACR122 is selected as the data register of the TDI to TDO path. This is achieved by scanning a predetermined bit configuration into instruction register 106 by means of an instruction register (IR-LOAD) sequence defined in the boundary scan standard previously referenced. Control of TAP controller 110 for register load sequences is achieved by manipulating TMS and TCK in a standard manner.

When other IC devices utilizing the present invention are connected to form extensions of the TDI to TDO path of IC200, registers equivalent to ACR122 are selected by loading similar bit configurations in their instruction registers as part of the same IR-LOAD sequence for IC200.

In step 4, ACR122 of IC200 is loaded with the bit configuration required for use in subsequent measurements. As shown in FIG. 5, this bit configuration selects ASWs and ASMs to be in either the connected or disconnected state when the instruction register is loaded with an analog instruction, and TAP controller 110 is in the RTI state. In the case of ASWs 134-1 through 134-N of ASM 134, TCK further determines the connect or disconnect state.

Step 4 is divided into parts 4A through 4G. In step 4A, ASWs 126, 128 and 132 of IC200 are set to states which disconnect pins TDI and TDO from each other and from digital control section 150. In step 4B, ASWs 134-E and 136-E are set to connect other predetermined ASWs of respective ASMs to pins TDO and TDI, respectively. In step 4C, the point A ASW of ASM 136 is set to connect point A to TDI through ASW 136-E. In step 4D, point B ASW of ASM 138 is set to connect point B to ground. In step 4E, point A ASW of ASM 134 is set to connect point A to TDO through ASW 134-E when TCK is at a logic one level. In step 4F, the point B ASW of ASM 134 is set to connect point B to TDO through ASW 134-E when TCK is at a logic zero level.

When other ICs utilizing the present invention are connected to form extensions of the TDI to TDO path of IC400, the equivalent of ACR122 in each of those ICs is loaded with a bit configuration to set the equivalent of ASW in the connect state and all other ASWs in the disconnect state, essentially providing an isolated path directly connecting TDO and TDI.

In step 5, another IR-LOAD sequence of the type previously referenced in step 3 is utilized to load the bit configuration for an analog instruction into each IC instruction register.

In step 6, the test system controlling the interface stops manipulating TCK and TMS when IC200 and other ICs connected as extensions of TDI and TDO enter the Run-Test-Idle state. TCK is set to and remains at a logic one level and TMS remains at a logic zero level.

In step 7, the controlling test system applies a predetermined voltage to the TDI pin of IC200 or IC forming an extension thereof and measures the current flow of the TDI circuit to ground. The primary current path consists of any equivalents of ASW 128 between the TDI terminal to which the test system is connected and the TDI terminal of IC200, AW 136-E, the point A ASW of ASM 136, resistor 210, the point B ASW of ASM 138 and associated connections.

In step 8, the test system measures the voltage at the TDO pin of IC200 or the extension of TDO to which the tester is connected relative to system ground. The measurement path consists of the point A ASW of ASM 134, any equivalents of ASW 128 between the TDO terminal of IC200, the TDO terminal of the IC connected to the test system and associated internal and external path connections.

In step 9, the test system sets TCK to a logic zero level, resulting in a reconfiguration of ASM 134 of IC400 by analog control decoder 124 in accordance with the group of bits selected by multiplexer 510. These bits cause the point A ASW to be forced to the disconnected state and point B ASW to be forced to the connected state.

In step 10, a voltage measurement is taken as in step 8, the difference being that the measurement path was altered in step 9 to connect point B to the test system instead of point A.

In step 11, the voltage value derived from the difference of the voltage measurements of steps 8 and 10 is divided by the current value derived from the current measurement of step 7 to calculate a resistance value of resistor 210.

Description of FIG. 3

FIG. 3 illustrates measuring the value of a resistor 310 connected to two pins of an integrated circuit 300 utilizing the present invention. The resistor is shown to be external to the IC, but the measurement process would be the same were it internal. Point A represents a pin of IC 300 which connects to resistor 310.

The steps required to measure resistor 510 utilizing the present invention may be summarized as follows:
1. Set isolation.
2. Reset TAP.
3. Set ACR122 in data path.
4. Load ACR 122 to provide the following ASM and ASW settings:
   A. ASW 126, 128, 132=disconnect state
   B. ASW 134-E, 136-E=connect state
   C. ASM 136=connect state to Point A
   D. ASM 138=disconnect state by virtue of a zero value of all input bits to decoder 507 causing output DO to be selected
   E. ASM 134=connect state to Point A when TCK=1
   G. ASM 134=connect state to Point A when TCK=0
5. Load ANALOG instruction in Instruction Register.
6. Suspend TAP activity at RTI state with TCK=1 or 0, TMS=0.
7. Apply voltage to TDI, measure current.
8. Measure voltage from TDO to system ground.
9. Calculate value of resistor 310.

Steps 1 through 3 relating to FIG. 3 are the same as those relating to FIG. 2.

In step 4, ACR122 of IC300 is loaded with the bit configuration required for use in subsequent measurements. As shown in FIG. 5, this bit configuration selects ASWs and ASMs to be in either the connected or disconnected state when the instruction register is loaded with an analog instruction, and TAP controller 110 is in the RTI state. In the case of ASWs 34-1 through 134-N of ASM 134, TCK further determines the connect or disconnect state.

Step 4 is divided into parts 4A through 4G. In step 4A, ASWs 126, 128 and 132 of IC300 are set to disconnect pins TDI and TDO from each other and from digital control section 150. In step 4B, ASWs 134-E and 36-E are set to states which connect other predetermined ASWs of respective ASMs to pins TDO and TDI, respectively. In step 4C, the point A ASW of ASM 136 is set to connect point A to TDI through ASW 136-E. Step 4D is included only for consistency with the previous description, however, no action occurs. In step 4E, point A ASW of ASM 134 is set to connect point A to TDO through ASW 134-E when TCK is at a logic one level. In step 4G, the point A ASW of ASM 134 is set to connect point B to TDO through ASW 134-E when TCK is at a logic zero level.

When other ICs utilizing the present invention are connected to form extensions of the TDI to TDO path of IC300, the equivalent of ACR122 in each of those ICs is loaded with a bit configuration to set the equivalent of ASW in the connect state and all other ASWs in the disconnect state, essentially providing an isolated path directly connecting TDO and TDI.

Steps 5 and 6 are essentially the same as those relating to IC200 in the previous description.

In step 7, the controlling test system applies a predetermined voltage to the TDI pin of IC300 or IC forming an extension thereof and measures the current flow (I) represented by reference numeral 320 of the TDI circuit to ground. The primary current path consists of any equivalents of ASW 128 between the TDI terminal to which the test system is connected and the TDI terminal of IC300, AW 136-E, the point A ASW of ASM 136, and resistor 310.

In step 8, the test system measures the voltage E represented by reference numeral 330 at the TDO pin of IC300 or the extension of TDO to which the tester is connected relative to system ground. The measurement path consists of the point A ASW of ASM 134, any equivalents of ASW 128 between the TDO terminal of IC300, the TDO terminal of the IC connected to the test system and associated connections.

In step 9, the voltage value derived from the voltage measurement of step 8 is divided by the current value derived from the current measurement of step 7 to calculate a resistance value of resistor 310.

Description of FIG. 4

FIG. 4 illustrates measuring the value of a resistor 410 connected to two pins of integrated circuits 400 and 402 utilizing the present invention. The resistor is shown to be external to the ICs, but the measurement process would be the same were it internal to one of them. Point A and point B represent pins of ICs 400 and 402 which connect to resistor 410.

The steps required to measure resistor 410 utilizing the present invention may be summarized as follows:
1. Set isolation.
2. Reset TAP.
3. Set ACR122s of IC400 and IC402 in data path.
4. Load ACR122s to provide the following ASM and ASW settings:
   A. ASW 126A, 126B, 128A, 132A, 132B=disconnect state, 128B=connect state
   B. ASW 134A-E, 134B-E, 136A-E=connect state, 136B-E=disconnect state
   C. All ASWs of ASM 138A set to disconnect by selecting DO at decoder 507 of IC400
   D. ASM 136A=connect state to Point A
   E. ASM 138B=connect state to Point B
   F. ASM 134A=connect state to Point A when TCK=1, ASM 134A set to all ASWs=disconnect state by selecting DO at decoder 509 of IC400 when TCK=1
   G. ASM 134B=connect state to Point B when TCK=0, ASM 134B set to all ASWs=disconnect state by selecting DO at decoder 509 of IC602 when TCK=0.
5. Load ANALOG instruction in Instruction Register.
6. Suspend TAP activity at RTI state with TCK=i, TMS=0.
7. Apply voltage to TDI, measure current.
8. Measure voltage from TDO to system ground.
9. Set TCK=0.
10. Repeat step 8.
11. Calculate value of resistor 410.

Steps 1 through 3 relating to FIG. 4 are the same as those relating to FIG. 2.

In step 4, ACR122 of IC400 is loaded with the bit configuration required for use in subsequent measurements. As shown in FIG. 5, this bit configuration selects ASWs and ASMs to be in either the connected or disconnected state when the instruction register is loaded with an analog instruction, and TAP controller 110 is in the RTI state. In the case of ASWs 134-1 through 134-N of ASW 134, TCK further determines the connect or disconnect state.

Step 4 is divided into parts 4A through 4G. In step 4A, ASWs 126A, 128A and 132A of IC400 are set to disconnect pins TDI and TDO from each other and from digital control section 150. In step 4A, ASWs 126B and 132B of IC402 are set to disconnect digital control section 150 from TDI and TDO, which are connected because ASW 128B is set to the connect state. In step 4B, ASWs 134A-E, 134B-E and 136A-E are set to connect other predetermined ASWs of their respective ASMs to TDO of IC400, TDO of IC402 and TDI of IC 400, respectively.

In step 4C, ASM 138A is effectively disabled by causing a logic one level at output DO at decoder 507 of IC400 since output DO is not connected to any ASW of ASM 138A. In step 4D, the point A ASW of ASM 136A is set to connect point A to TDI of IC600 through ASW 136A-E. In step 4E, point B ASW of ASM 138B is set to connect point B to ground. In step 4F, point A ASW of ASM 134A is set to connect point A to TDO of IC 400 through ASW 134-E when TCK is at a logic one level. In step 4G, the point B ASW of ASM 134B is set to connect point B to TDO of IC 402 through ASW 134B-E when TCK is at a logic zero level. As stated previously, the TDO pins of IC400 and IC402 are connected by virtue of ASW 128B having been set to the connect state, and no ASW of ASM 134A having been set to connect when TCK=0, nor is any ASW of ASM 134B set to connect when TCK=1.

When other ICs utilizing the present invention are connected to form extensions of the TDI to TDO path of ICs 400 and 402, the equivalent of ACR122 in each of those other ICs is loaded with a bit configuration to set the equivalent of ASW128A in the connect state and all other ASWs in the disconnect state, essentially providing an isolated path directly connecting TDO and TDI.

Steps 5 and 6 are essentially the same as those relating to IC200 in the previous description.

In step 7, the controlling test system applies a predetermined voltage to the TDI pin of IC400 or IC forming an extension thereof and measures the current flow of the TDI circuit to ground. The primary current path consists of any equivalents of ASW 128A between the TDI terminal to which the test system is connected and the TDI terminal of IC400, ASW 136A-E, the point A ASW of ASM 136A, resistor 410, the point B ASW of ASM 138B and associated internal and external path connections.

In step 8, the test system measures the voltage at the TDO pin of IC402 or the extension of TDO to which the tester is connected relative to system ground. The measurement path consists of the point A ASW of ASM 134A, ASW 128B, any equivalents of ASW 128B between the TDO terminal of IC402 and the TDO terminal of the IC connected to the test system and associated connections.

In step 9, the test system sets TCK to a logic zero level, resulting in a reconfiguration of ASM 134B of IC402 as described above whereby the point A ASW thereof is forced to the disconnected state and the point B ASW thereof is forced to the connected state.

In step 10, a voltage measurement is taken as in step 8, the difference being that the measurement path was altered in step 9 to connect point B to the test system instead of point A.

In step 11, the voltage value derived from the difference of the voltage measurements of steps 8 and 10 is divided by the current value derived from the current measurement of step 7 to calculate a resistance value of resistor 410.

From the above, it is seen that the present invention provides the capability of extending a standard boundary scan interface for processing both analog and digital signals without additional terminals beyond the four or five terminals conventionally used.

It will be appreciated by those skilled in the art that many changes may be made to the preferred embodiment of the present invention without departing from its teachings. For example, the invention is not limited to any specific boundary scan architecture or specific instruction coding.

Also, for example, values of capacitive or inductive circuit elements may be determined by utilizing the methods described above for measuring resistive elements by substituting AC source and AC measurement means instead of the DC source and DC measurement means utilized above. Furthermore, the above apparatuses and methods may also be used to externally monitor test points within a system without interference during normal system functional operations. External controlling of test points may also be accomplished by applying the appropriate currents and voltages to such points. Still further, common parametric measurements may be made of logic elements (e.g., input threshold voltage) contained within IC devices utilizing the present invention by appropriate selection of test points.

Still further, analog switches capable of processing negative voltages may be utilized to allow measurements where such voltages are necessary. This may require the application of additional negative power to the IC device.

Still further, test circuits may be incorporated in IC devices utilizing the present invention which modify the signals at desired system functional points to fall within the constraints imposed by the technology utilized in design of the test circuits (e.g., voltage or frequency limits).

Still further, additional reference voltage other than ground may be used to benefit in measuring analog values.

Still further, alterations to signal TMS may additionally be utilized as a means of further modifying analog switch matrix settings without changing boundary scan instructions, provided that TMS and TCK changes are limited to those which do not depend on digital values required to be present on the TDI pin.

Still further, the analog control register may be constructed with separate shift and hold sections to provide a means of altering matrix settings.

Still further, the method and apparatus of the referenced patent application may be utilized to prevent instruction register changes except by causing a test logic reset. This allows manipulation of TMS and TCK signals in altering the states of analog switch matrices with great flexibility.

Still further, storage elements within the boundary scan register may be utilized in place of otherwise separate and dedicated elements of an analog control register.

While in accordance with the provisions and statutes there has been illustrated and described the best form of the invention, certain changes may be made without departing from the spirit of the invention as set forth in the appended claims and that in some cases, certain features of the invention may be used to advantage without a corresponding use of other features.

What is claimed is:

1. A method of extending the capability of a standard boundary scan interface to process both digital and analog signals, said interface having a digital data input (TDI) terminal and a digital data output (TDO) terminal and a digital control section for defining a plurality of operational states for said interface and for generating in response to instructions applied to the interface, control signals used to control the boundary scan testing of functional logic circuits within a system contained in a number of integrated circuits (ICs), each IC including the boundary scan interface for carrying out said boundary scan testing and said method comprising the steps of:
 (a) connecting first analog switching circuit means included for extending the interface, between the TDI and TDO for enabling selective transfer of analog signals therebetween when said interface is operating in an analog mode;
 (b) connecting control means included within the digital control section included for extending the interface, to the TDI and TDO terminals; and,
 (c) connecting the control means to operate under the control of the digital control section in response to said instructions, said control means when enabled by a predetermined type of instruction decoded by the digital control section specifying that the interface is to operate in said analog mode and is in a predetermined one of said operational states, generating enabling signals for connecting the TDI and TDO terminals through said first analog switching circuit means for passing and monitoring analog signals for testing elements included in another IC.

2. A method of extending the capability of a standard boundary scan interface to process both digital and analog signals, said interface having a digital data input (TDI) terminal and a digital data output (TDO) terminal and a digital control section for defining a plurality of operational states for said interface and for generating in response to instructions applied to the interface, control signals used to control the boundary scan testing of functional logic circuits within a system contained in a number of integrated circuits (ICs), each IC including the boundary scan interface for carrying out said boundary scan testing and said method comprising the steps of:
 (a) connecting first analog switching circuit means included for extending the interface, between the TDI and TDO for enabling selective transfer of analog signals therebetween when said interface is operating in an analog mode;
 (b) connecting the TDI terminal to a first number of test and control points within the functional logic circuits of the IC through second analog switching circuit means included for extending the interface, for establishing at least one first circuit path;
 (c) connecting the TDO terminal to a second number of test and control points within the functional logic circuits through third analog switching circuit means included for extending the interface, for establishing at least one second circuit path;
 (d) connecting control means included within the digital control section included for extending the interface, to the TDI and TDO terminals and to each of the first, second and third analog switching means; and,
 (e) connecting the control means to operate under the control of the digital control section in response to said instructions, said control means when enabled by a predetermined type of instruction decoded by the digital control section specifying that the interface is to operate in said analog mode and is in a predetermined one of said operational states, generating enabling signals for connecting predetermined ones of the analog switching circuit means to provide first and second circuit paths to selected ones of said test and control points for passing and monitoring analog signals for testing elements connected to the test and control points.

3. The method of claim 2 wherein the elements are included as part of the functional logic circuits of the IC.

4. The method of claim 2 wherein the elements are located external to the functional logic circuits of the IC.

5. The method of claim 2 wherein said method further includes the steps of:
 (f) connecting a number of voltage reference potential points to a third number of test and control points within the functional logic circuits through fourth analog switching circuit means included for extending the interface, for applying reference voltage potentials to the third number of test and control points when said interface is operating in said analog mode.

6. The method of claim 2 wherein each of said first, second and third analog switching means includes a number of analog switches and said digital control section including a plurality of registers connected between said TDI and TDO terminals, one of said plurality of registers corresponding to an instruction register for storing said instructions applied to said interface, said method further including the steps of:
 (f) connecting one of said plurality of registers as an analog control register for storing a predetermined data bit pattern loaded into said analog control register by the digital control section in response to decoding of said predetermined type of instruction; and,
 (g) coding said data bit pattern to specify connect and disconnect states for said number of analog switches in said first, second and third analog switching means for establishing said first and second circuit paths.

7. The method of claim 6 wherein said number of said analog switches in said first analog switching circuit means is one and wherein the number of said analog switches in said second and third analog switching means is related to the number of test and control points and is arranged to form a matrix.

8. The method of claim 6 wherein said method further includes the step of:
 (h) connecting conversion circuits between the analog control register and the first analog switching circuit means, said second and third analog switching means, said conversion circuits generating control signals for establishing said connect and disconnect states for said number of analog switches.

9. The method of claim 8 wherein said digital control section further includes a state machine for generating a plurality of state signals defining said operational states for said interface, said conversion circuits include a number of decoder circuits and configuration logic circuits, and wherein said method further includes the steps of:

(i) connecting a different one of said decoder circuits to said second and third analog switching means and to a different part of said analog control register;

(j) connecting said configuration logic circuits to said instruction control register for receiving a predetermined signal defining said analog mode of operation and to said state machine for receiving a predetermined one of said plurality of state signals indicating when said interface is in a reset state;

(k) connecting said configuration logic circuits to each of said decoder circuits and to said first analog switching means for enabling said first analog switching means and said plurality of decoder circuits in response to said predetermined signal and said predetermined one of said plurality of state signals for configuring said first analog switching means, said second and said third analog switching means for operating in said analog mode.

10. Apparatus for extending the capability of a standard boundary scan interface to process both digital and analog signals, said interface having a digital data input (TDI) terminal and a digital data output (TDO) terminal and a digital control section for defining a plurality of operational states for said interface and for generating in response to instructions applied to the interface, control signals used to control the boundary scan testing of functional logic circuits within a system contained in a number of integrated circuits (ICs), each IC including a number of test and control points and the boundary scan interface for carrying out said boundary scan testing and said apparatus comprising:

first analog switching circuit means connected between said TDI and TDO terminals for enabling selective transfer of analog signals therebetween when said interface is operating in an analog mode; and, control means included within the digital control section connected to said TDI and TDO terminals and to said first analog switching circuit means, said control means when enabled by a predetermined type of instruction decoded by the digital control section specifying that the interface is to operate in said analog mode and is in a predetermined one of said operational states, generating enabling signals for connecting the TDI and TDO terminals through said first analog switching circuit means for passing and monitoring analog signals for testing elements connected to said test and control points.

11. Apparatus for extending the capability of a standard boundary scan interface to process both digital and analog signals, said interface having a digital data input (TDI) terminal and a digital data output (TDO) terminal and a digital control section for defining a plurality of operational states for said interface and for generating in response to instructions applied to the interface, control signals used to control the boundary scan testing of functional logic circuits within a system contained in a number of integrated circuits (ICs), each IC including the boundary scan interface for carrying out said boundary scan testing, said apparatus comprising:

first analog switching circuit means connected between the TDI and TDO for enabling selective transfer of analog signals therebetween when said interface is operating in an analog mode;

second analog switching circuit means connecting the TDI terminal to a first number of test and control points within the functional logic circuits of each IC for establishing at least one first circuit path;

third analog switching circuit means connecting the TDO terminal to a second number of test and control points within the functional logic circuits of each IC for establishing at least one second circuit path; and, control means included within the digital control section connected to the TDI and TDO terminals and to each of the first, second and third analog switching means;

said control means when enabled by a predetermined type of instruction decoded by the digital control section specifying that the IC interface is to operate in said analog mode and is in a predetermined one of said operational states, generating enabling signals for connecting predetermined ones of the analog switching circuit means to provide first and second circuit paths to selected ones of said test and control points for passing and monitoring analog signals, for testing elements connected to the test and control points.

12. The apparatus of claim 11 wherein the elements are located external to the functional logic circuits of said each IC.

13. The apparatus of claim 11 wherein the elements are included as part of the functional logic circuits of said each IC.

14. The apparatus of claim 12 wherein said apparatus further includes:

fourth analog switching circuit means connecting a number of voltage reference potential points to a third number of test and control points within the functional logic circuits for applying reference voltage potentials to the third number of test and control points when said interface is operating in said analog mode.

15. The apparatus of claim 12 wherein each of said first, second and third analog switching means includes a number of analog switches and said digital control section includes a plurality of registers connected between said TDI and TDO terminals, said plurality of registers including an instruction register for storing said instructions applied to said interface.

16. The apparatus of claim 15 wherein said plurality of registers further includes an analog control register for storing a predetermined data bit pattern loaded into said analog control register by the digital control section in response to decoding of said predetermined type of instruction, said data bit pattern being coded to specify connect and disconnect states for said number of analog switches in said first, second and third analog switching means for establishing said first and second circuit paths.

17. The apparatus of claim 15 wherein said number of said analog switches in said first analog switching circuit means is one and wherein the number of said analog switches in said second and third analog switching means is related to the number of test and control points, said number of analog switches of said second and third analog switching means being arranged to form a matrix.

18. The apparatus of claim 15 wherein said apparatus further includes:

conversion circuits connected between the analog control register and the first analog switching circuit means, said second and third analog switching means, said conversion circuits generating control signals for establishing said connect and disconnect states for said number of analog switches in accordance with data bit patterns loaded into said analog control register.

19. The apparatus of claim 18 wherein said digital control section further includes a state machine for generating a plurality of state signals defining said operational states for said interface and wherein said conversion circuits include a number of decoder circuits and configuration logic circuits.

20. The apparatus of claim 19 wherein said apparatus further includes:

first circuit means for connecting a different one of said decoder circuits to said second and third analog switching means and to a different part of said analog control register;

second circuit means for connecting said configuration logic circuits to said instruction control register for receiving a predetermined signal defining said analog mode of operation and to said state machine for receiving a predetermined one of said plurality of state signals indicating when said interface is in a reset state; and, third circuit means for connecting said configuration logic circuits to each of said decoder circuits and to said first analog switching means for enabling said first analog switching means and said plurality of decoder circuits in response to said predetermined signal and said predetermined one of said plurality of state signals for configuring said first analog switching means, said second and said third analog switching means in accordance with predetermined ones of said predetermined data bit pattern for operating in said analog mode.

* * * * *